(12) United States Patent
Hung et al.

(10) Patent No.: US 10,163,669 B2
(45) Date of Patent: Dec. 25, 2018

(54) METROLOGY SYSTEM AND MEASUREMENT METHOD USING THE SAME

(71) Applicant: TAIWAN SEMICONDUCTOR MANUFACTURING CO., LTD., Hsinchu (TW)

(72) Inventors: Ying-Chieh Hung, Hsinchu (TW); Ming-Hua Yu, Hsinchu (TW); Yi-Hung Lin, Taipei (TW); Jet-Rung Chang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 275 days.

(21) Appl. No.: 15/010,935

(22) Filed: Jan. 29, 2016

(65) Prior Publication Data

US 2017/0221739 A1 Aug. 3, 2017

(51) Int. Cl.
| | | |
|---|---|---|
| *G01B 11/02* | (2006.01) | |
| *H01L 21/67* | (2006.01) | |
| *G01B 11/06* | (2006.01) | |
| *H01L 21/02* | (2006.01) | |
| *H01L 21/265* | (2006.01) | |
| *H01L 21/324* | (2006.01) | |
| *H01L 21/66* | (2006.01) | |

(52) U.S. Cl.
CPC .... *H01L 21/67253* (2013.01); *G01B 11/0625* (2013.01); *H01L 21/02694* (2013.01); *H01L 21/265* (2013.01); *H01L 21/324* (2013.01); *H01L 22/12* (2013.01)

(58) Field of Classification Search
CPC ......... H01L 21/67253; H01L 21/02694; H01L 21/265; H01L 21/324; H01L 22/12; H01L 22/26; G01B 11/0625; G01B 11/06; G01B 11/0675; G01B 11/0683; G01B 9/02057; G01N 21/8422; G01N 21/9501
USPC ........................................................ 356/503
See application file for complete search history.

(56) References Cited

U.S. PATENT DOCUMENTS 5,604,581 A * 2/1997 Liu .................... G01B 11/0625
356/632
6,008,906 A 12/1999 Maris
9,410,890 B2 8/2016 Sappey
(Continued)

FOREIGN PATENT DOCUMENTS

| TW | 485405 | 5/2002 |
| TW | 201346243 A | 11/2013 |
| TW | 201520510 A | 6/2015 |

*Primary Examiner* — Tarifur R Chowdhury
*Assistant Examiner* — Jonathon Cook
(74) *Attorney, Agent, or Firm* — Slater Matsil, LLP

(57) ABSTRACT

A method for thickness measurement includes forming an implantation region in a semiconductor substrate. A semiconductor layer is formed on the implantation region of the semiconductor substrate. Modulated free carriers are generated in the implantation region of the semiconductor substrate. A probe beam is provided on the semiconductor layer and the implantation region of the semiconductor substrate with the modulated free carriers therein. The probe beam reflected from the semiconductor layer and the implantation region is detected to determine a thickness of the semiconductor layer.

20 Claims, 8 Drawing Sheets

(56) References Cited

U.S. PATENT DOCUMENTS

| | | | |
|---|---|---|---|
| 2005/0057754 A1* | 3/2005 | Smith | G01N 21/4788 |
| | | | 356/445 |
| 2011/0027919 A1 | 2/2011 | Wack et al. | |
| 2013/0003050 A1 | 1/2013 | Zhu et al. | |
| 2016/0260612 A1* | 9/2016 | Price | G01B 11/0683 |

* cited by examiner

METROLOGY SYSTEM AND MEASUREMENT METHOD USING THE SAME

BACKGROUND

Fabrication of many semiconductor devices includes the formation of a deposition layer on a semiconductor substrate. The deposition layer has a controlled composition and thickness. It has been practice to measure the thickness of the deposition layer formed on the semiconductor substrate. The measuring technique for such layer thickness control is desired to have high precision, to be simple, to be able to measure in a short period of time, and to uniquely determine layer thicknesses.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
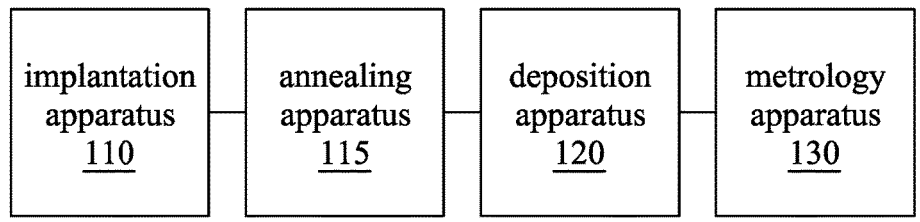
FIG. 1 is a block diagram of a metrology system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide a metrology system and some methods for evaluating a thickness of a semiconductor layer formed on a semiconductor substrate using the metrology system. These embodiments are discussed below in the context of evaluating a silicon layer formed on a silicon substrate. One of ordinary skill in the art will realize that embodiments of the present disclosure may be applied to other semiconductor layers and substrates having other materials.

Figure 2:
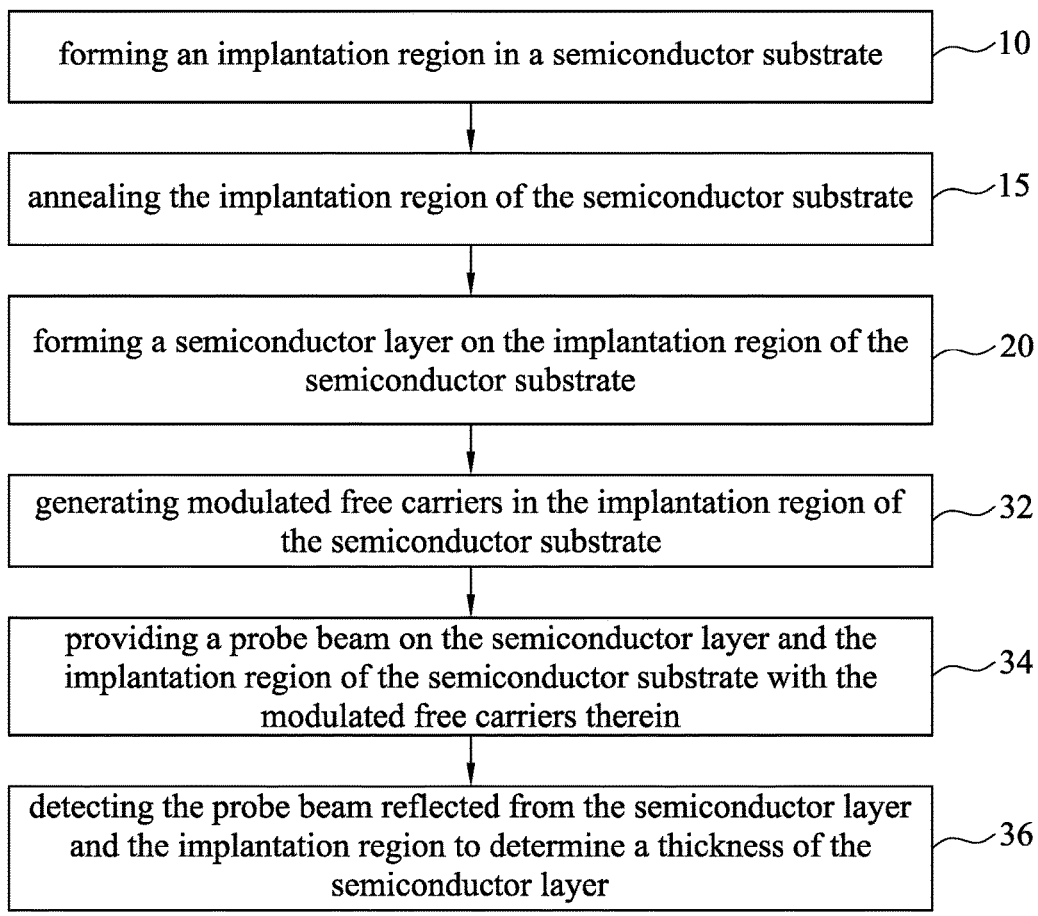
FIG. 2 is a flowchart of a method for evaluating a thickness of a semiconductor layer formed on a semiconductor substrate in accordance with some embodiments.
Figure 3A:
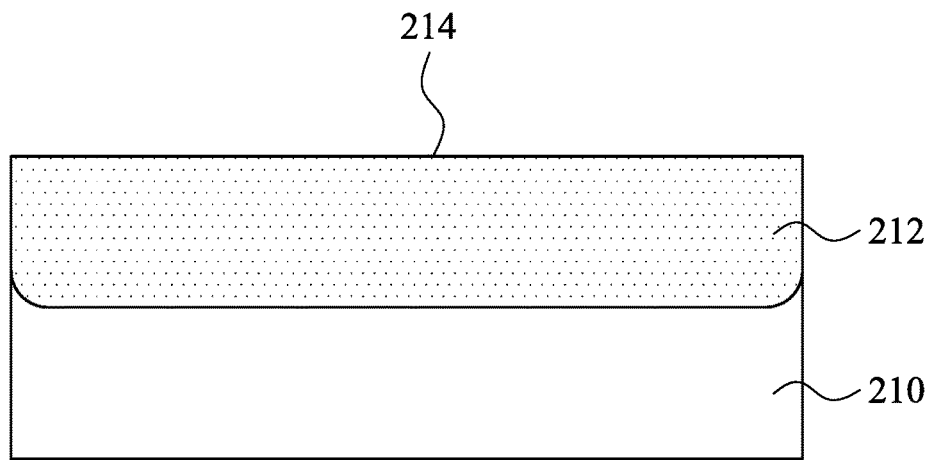
FIGS. 3A to 3C are cross-sectional views of the method for manufacturing a semiconductor sample at different stages in accordance with some embodiments.
Figure 3B:
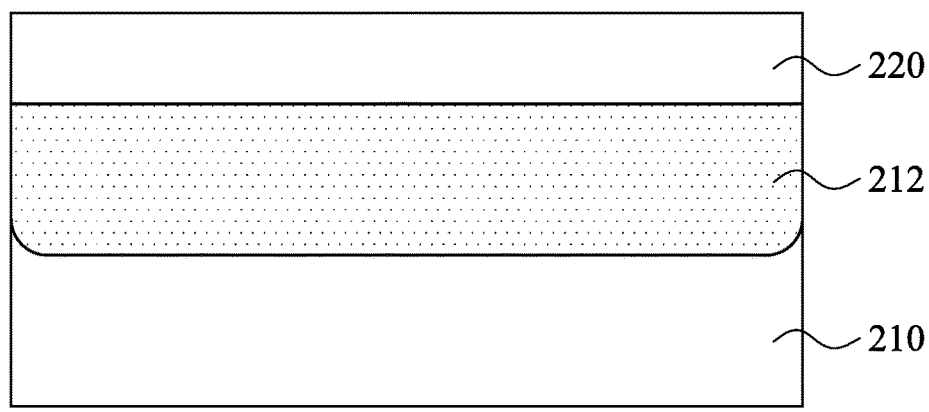
Figure 3C:
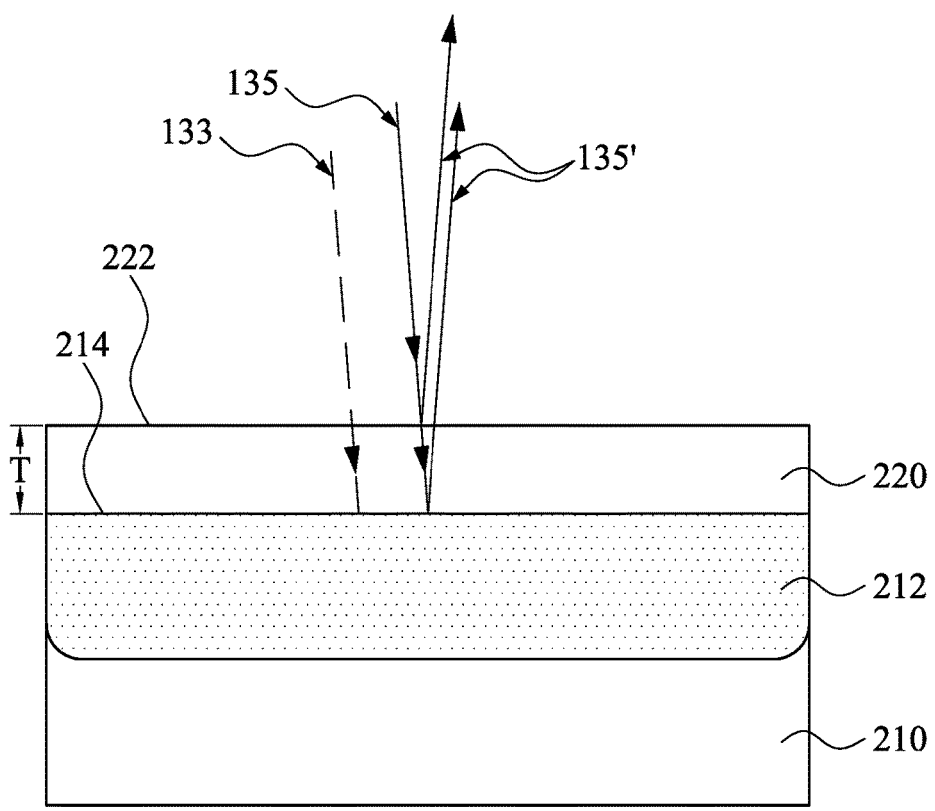

FIG. 1 is a block diagram of a metrology system 100 in accordance with some embodiments, FIG. 2 is a flowchart of a method for evaluating a thickness of a semiconductor layer 220 formed on a semiconductor substrate 210 in accordance with some embodiments, and FIGS. 3A to 3C are cross-sectional views of the method for manufacturing a semiconductor sample 200 at different stages in accordance with some embodiments. The metrology system 100 can be applied to evaluate a thickness of the semiconductor layer 220 formed on the semiconductor substrate 210.

Reference is made to FIG. 3A. The semiconductor substrate 210 is provided. In some embodiments, the semiconductor substrate 210 includes bulk silicon (Si) that is undoped. Other materials that are suitable for semiconductor device formation may be used. Other materials, such as group III elements, group V elements, or combinations thereof, can be used for the semiconductor substrate 210. For example, silicon germanium (SiGe), gallium arsenide (GaAs) could alternatively be used for the semiconductor substrate 210. In some embodiments, the material of the semiconductor substrate 210 has a band gap smaller than about 6 eV, and the claimed scope is not limited in this respect. For example, the band gap of Si is about 1.12 eV, the band gap of SiGe is about 1.12 eV to about 1.86 eV, the band gap of GaAs is about 1.43 eV, and the band gap of gallium nitride (GaN) is about 3.5 eV.

Reference is made to FIGS. 2 and 3A. At operation 10, an implantation region 212 is formed in the semiconductor substrate 210. In some embodiments, the implantation region 212 is a doped region. In other words, the semiconductor substrate 210 is doped to form the doped region therein. Dopants as ions are implanted to the semiconductor substrate 210 during the ion implantation process. In some ion implantation processes, an ion beam is rastered over the semiconductor substrate 210. Some of the ions in the ion beam are introduced into the lattice structure of the semiconductor substrate 210. The duration and intensity of the ion implantation process (i.e., total exposure of the semiconductor sample) controls the resulting dopant concentration. The ion energy used during the implantation process controls the depth of implant. Both concentration and depth are factors that determine the overall effectiveness of the ion implantation process. For an n-type implantation region, the implantation region 212 can be doped with n-type dopants, such as phosphorus (P) or arsenic (As). For a p-type implantation region, the implantation region 212 can be doped with p-type dopants, such as boron (B), and the claimed scope is not limited in this respect.

Reference is made to FIGS. 1 and 3A. The metrology system 100 includes an implantation apparatus 110, a deposition apparatus 120, and a metrology apparatus 130. The implantation apparatus 110 is configured to form the implantation region 212 in the semiconductor substrate 210. In some embodiments, the implantation apparatus 110 includes an ion source which ionizes solids, liquids, or gases, an electrostatic extraction field to extract these ions, an acceleration device, an analyzing device where these ions are separated according to their mass, and a scanning device to distribute the ions uniformly over a target. Depending on the arrangement of the acceleration apertures, the magnets, and their respective grounding, there are three configurations (Post-Analysis configuration, Pre-Analysis configuration, and Post-Analysis with Post-Acceleration configuration) in use.

In the Post-Analysis configuration cases, the ions are accelerated to their substantially full energy before mass separation. Hence, the source is on high voltage and remote control while all other sections are grounded and directly accessible. This configuration also has large magnet to handle the high ion energies as well as changing the magnet current and the focusing conditions with changing energies. The ion beam depends on the acceleration voltage, resulting in high current at high energies.

With the Pre-Analysis configuration, the ions are extracted with energies of about 15 to about 40 kV, are then analyzed, and accelerated to their desired energy. The magnet can be kept small, and the energy variations (for example, to implant control profiles) are easy to carry out by adjustment of the acceleration voltage. The ion current is not very sensitive to the energy variations. The electric power, cooling, vacuum, and data control of the source and the analyzing section is electrically isolated.

In the Post-Analysis with Post-Acceleration configuration cases, for an additional increase in the energy range, a second acceleration stage is provided by placing the target on high voltage.

Reference is made to FIGS. 1, 2, and 3A. Dopant activation after the ion implantation operation can be performed by rapidly heating and cooling the semiconductor substrate 210 in a chamber. This process is annealing of the implantation region 212 of the semiconductor substrate 210, as shown at operation 15 of FIG. 2. In some embodiments, the metrology system 100 of FIG. 1 can further include an annealing apparatus 115 to anneal the implantation region 212 of the semiconductor substrate 210. The annealing apparatus 115 can be a rapid thermal annealing equipment or an annealing furnace.

During the anneal process, dopant ions diffuse away from the surface 214 of the implantation region 212 of the semiconductor substrate 210 and form a concentration profile within the implantation region 212 of the semiconductor substrate 210. The transition between the implantation region 212 including the activated dopants and the non-implanted substrate is referred to as a junction. The annealing process may include rapid thermal annealing (RTA), furnace annealing, flash lamp annealing (FLA), laser spike annealing (LSA), or combinations thereof.

Rapid thermal annealing is a process used in semiconductor device fabrication which includes of heating a single substrate (the semiconductor substrate 210 for example) at a time in order to affect its electrical properties. Different heat treatments are designed for different effects. Rapid thermal anneals are performed by equipment that heats a single substrate at a time using lamp based heating that the substrate is brought near. The temperature of the substrate is determined with an indirect sensor, based on the radiation emitted by the substrate. As soon as the substrate reaches this temperature, it is held there for a few seconds and then quenched.

In the furnace annealing process, atoms at the amorphous-crystalline interface rearrange themselves into crystalline locations by a process that involves vacancy diffusion in both the crystalline and disordered layer. The implanted dopants are incorporated into substitutional sites during this recrystallization process, leading to high electrical activity. In some embodiments, the furnace annealing process proceeds two stages. The first stage is carried out at about 600° C. and 30 minutes and is intended to recrystallize the implantation region. A number of point and line defects remain after this stage, which lead to low electrical activity and poor carrier mobility and lifetime. The low temperature anneal is then followed by a 1000° C. and 10 minutes anneal to remove point defects, increase carrier mobility and lifetime, and provide for some impurity diffusion.

Reference is made to FIGS. 1, 2, and 3B. At operation 20, a semiconductor layer 220 is formed on the implantation region 212 of the semiconductor substrate 210. That is, the semiconductor layer 220 is in contact with the semiconductor substrate 200, and there is no additional layer present between the semiconductor layer 220 and the implantation region 212. The semiconductor layer 220 and the semiconductor substrate 210 share at least one common material or element. The semiconductor layer 220 and the semiconductor substrate 210 may be formed of substantially the same material. For example, the semiconductor layer 220 and the semiconductor substrate 210 are both made of silicon. In some embodiments, the semiconductor layer 220 and the semiconductor substrate 210 have substantially the same dielectric properties and/or optical properties. For example, a dielectric constant of the semiconductor layer 220 and a dielectric constant of the semiconductor substrate 210 have a difference less than about $10^{-2}$. In some embodiments, the semiconductor substrate 210 is a silicon substrate, and the semiconductor layer 220 is a silicon layer. However, in some other embodiments, the semiconductor substrate 210 and the semiconductor layer 220 include group III elements, group V elements, or combinations thereof. For example, the semiconductor substrate 210 and the semiconductor layer 220 include silicon germanium (SiGe), gallium arsenide (GaAs). In some embodiments, the material of the semiconductor layer 220 has a band gap smaller than about 6 eV, and the claimed scope is not limited in this respect. Basically, embodiments fall within the claimed scope if the semiconductor layer 220 and the semiconductor substrate 210 have substantially the same dielectric properties and/or substantially optical properties.

The deposition apparatus 120 of FIG. 1 is configured to form the semiconductor layer 220 on the implantation region 212 of the semiconductor substrate 210. The semiconductor layer 220 may be deposited on the semiconductor substrate 210 by a variety of methods such as epitaxy or chemical vapor deposition (CVD) process. That is, the deposition apparatus 120 can be an epitaxy apparatus or a CVD apparatus. Some methods of growing the semiconductor layer 220 involve heating the semiconductor substrate 210 to between about 1050° C. and about 1200° C. in a reaction vessel; purging the HCl gas from a reaction vessel; and reacting dichlorosilane and hydrogen gas in the reactor furnace to grow the semiconductor layer 220 at a growth rate of at least 5 μm/minute. In some embodiments, trichlorosilane, tetrachlorosilane, or a number of other silane-based gases may optionally be used in place of dichlorosilane.

The epitaxy process is similar to what happens in CVD processes, however, if the semiconductor substrate 210 is an ordered semiconductor crystal (i.e. Si, SiGe or GaAs), it is possible with this process to continue building on the semiconductor substrate 210 with the same crystallographic orientation with the semiconductor substrate 210 acting as a seed for the deposition. If an amorphous/polycrystalline substrate surface is used, the layer will also be amorphous or polycrystalline. There are several technologies for creating the conditions inside a reactor needed to support epitaxial growth, one of which is Vapor Phase Epitaxy (VPE). In this process, a number of gases are introduced in an induction heated reactor where only the semiconductor substrate 210 is heated. The temperature of the semiconductor substrate 210 typically is at least about 50% of the melting point of the material to be deposited.

CVD is a process whereby a solid film is synthetized from the gaseous phase by a chemical reaction. In the CVD process, the semiconductor substrate 210 is placed inside a reactor to which a number of gases are supplied. The principle of the process is that a chemical reaction takes place between the source gases. The product of that reaction is a solid material with condenses on the surfaces inside the reactor.

Figure 4:
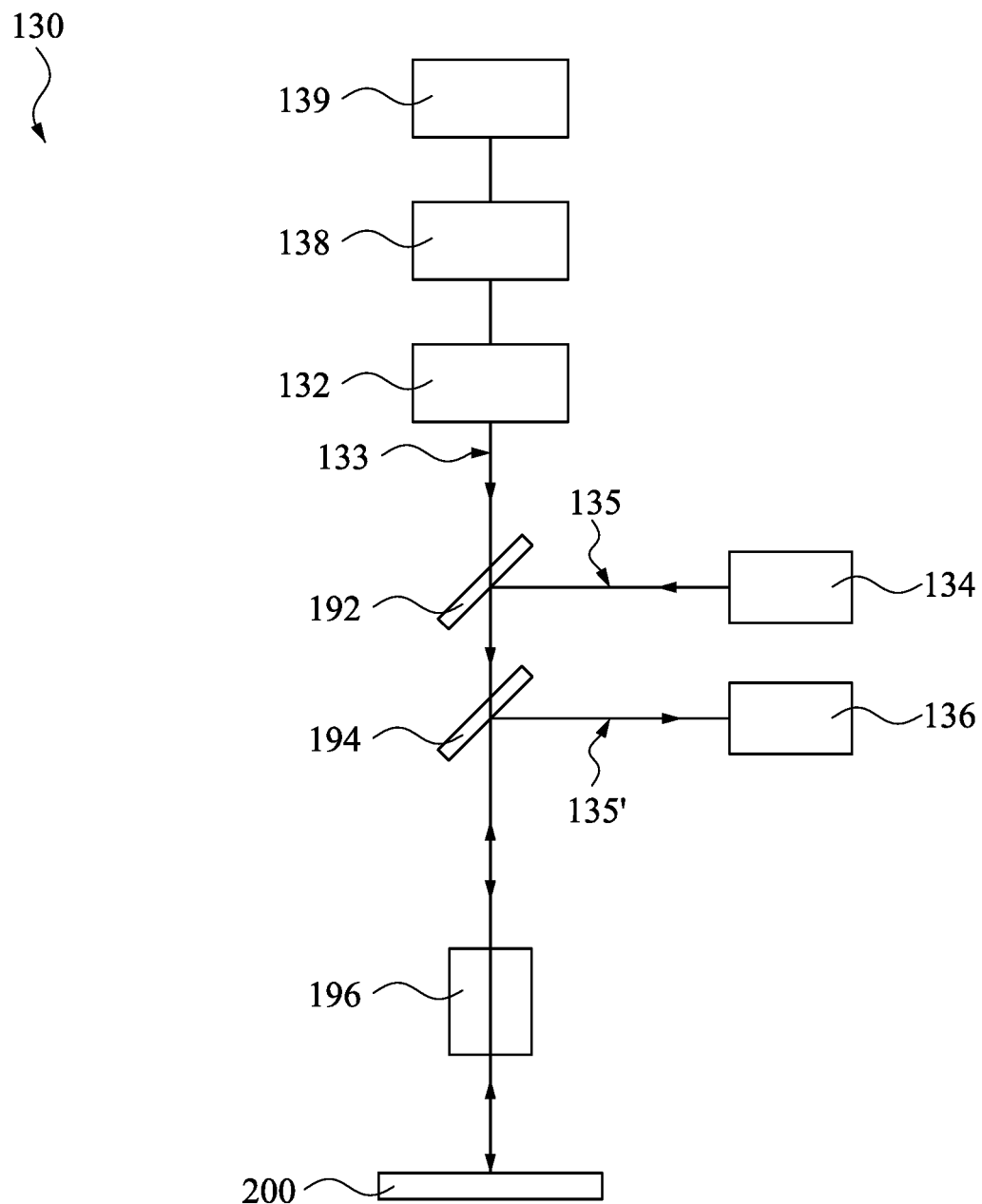
FIG. 4 is a schematic diagram of a metrology apparatus of FIG. 1 and the semiconductor sample of FIG. 3C in accordance with some embodiments.

Subsequently, a thickness of the semiconductor layer 220 is measured. In FIG. 1, the metrology apparatus 130 is configured to measure the thickness of the semiconductor layer 220. In greater detail, FIG. 4 is a schematic diagram of the metrology apparatus 130 of FIG. 1 and the semiconductor sample 200 of FIG. 3C in accordance with some embodiments. Reference is made to FIGS. 3C and 4. The metrology apparatus 130 includes a photomodulation source 132, a probe source 134, and a detector 136. The photomodulation source 132 is configured to generate modulated free carriers in the implantation region 212 of the semiconductor substrate 210. The probe source 134 is configured to provide a probe beam 135 on the semiconductor layer 220 and the implantation region 212. The detector 136 is configured to detect the probe beam 135 reflected from the semiconductor layer 220 and the implantation region 212 to determine the thickness T of the semiconductor layer 220.

Reference is made to FIGS. 2, 3C, and 4. At operation 32, the implantation region 212 of the semiconductor substrate 210 is photomodulated by, for example, a modulated pump beam 133 of the photomodulation source 132. In FIG. 3C, the free carriers are periodically generated in the implantation region 212 of the semiconductor substrate 210. In other words, the implantation region 212 is periodically photomodulated. The photomodulation source 132 can be a pump laser. Gas, solid state, or semiconductor lasers can be used. Other photomodulated sources for exciting the implantation region 212 can include different sources of electromagnetic radiations or particle beams such as from an electron gun. In some embodiments, the photomodulation is periodic waves periodically exciting (or heating) the implantation region 212. The pump beam 133 passes through dichroic mirrors 192 and 194 and impinges on the implantation region 212.

In some embodiments, the photomodulation source 132 can generate a pump beam, where the pump beam may have visible, near infrared, or infrared wavelength. The pump beam of the photomodulation source 132 can be linearly polarized. The photomodulation source 132 is connected to a power supply 138 which is under control of a processor 139. The pump beam of the photomodulation source 132 is intensity modulated through the output of power supply 138 to become the modulated pump beam 133. The modulation frequency may be in a range of 100 KHz to 100 MHz. In some embodiments, the modulation frequency can be set up to 125 MHz. If an ion laser, such as an argon ion layer, is used to generate the modulated pump beam 133, the intensity modulation can be achieved by a separate acousto-optic modulator (not shown).

Since the implantation region 212 is excited, the optical property difference between the implantation region 212 and the semiconductor layer 220 is enhanced, such that the implantation region 212 can be a reference layer to determine the thickness T of the semiconductor layer 220. In greater detail, when the implantation region 212 of the semiconductor substrate 210 is illuminated with the modulated pump beam 133, electrons in the valence band absorb the incident energy and cross the forbidden energy gap toward the conduction band, leaving an equal number of holes behind in the valence band. On a picosecond time scale, electrons and holes become photomodulated with the lattice through phonon emitting, releasing the excess energy, and end up at the bottom of the conduction band for the electrons and the top of the valence band for the holes. Following photoexcitation the carriers will diffuse to the lattice and eventually recombine and transfer their energy to the implantation region 212. When the illumination of the implantation region 212 is harmonically modulated, wave like solution to the plasma (electron and hole combination) diffusion equation exist, known as plasma waves traveling in the implantation region 212. The recombination mechanism of relaxation have as a consequence the rise of local temperature of the implantation region 212. Since the modulated pump beam 133 is modulated, modulated free carriers (or plasma waves) are generated from the implantation region 212. In some embodiments, the pump beam 133 is periodic, so the implantation region 212 is periodically modulated and generates periodic plasma waves. In accordance with the principle mentioned above, the plasma waves generated from the implantation region 212 are absorbed into the implantation region 212. Hence, the optical properties of the implantation region 212 is different from the semiconductor layer 220 and the un-doped region of the semiconductor substrate 210.

The plasma waves have effects on the reflectivity of the surface 214 (see FIG. 3C) of the implantation region 212. Features and/or regions below the surface 214 that alter the passage of the plasma waves will therefore alter the optical reflective patterns at the surface 214 of the implantation region 212. By measuring (or monitoring) the changes in reflectivity of the implantation region 212 at the surface 214, information about characteristics around the surface 214 can be investigated.

At operation 34, a probe beam 135 is provided on the semiconductor layer 220 and the implantation region 212. The probe source 134 of FIG. 4 provides the probe beam 135. The probe source 134 can be a laser. Gas, solid state, or semiconductor lasers can be used. For example, the probe source 134 can be a helium-neon (He—Ne) laser. In some embodiments, the probe beam 135 may have visible, near infrared, or infrared wavelength. The probe beam 135 of the probe source 134 can be linearly polarized. The modulated pump beam 133 and the probe beam 135 have different wavelengths. Hence, the probe beam 135 impinges on the dichroic mirror 192 is reflected by the dichroic mirror 192. Therefore, the modulated pump beam 133 and the probe beam 135 can be combined, i.e., the modulated pump beam 133 and the probe beam 135 are collinear. After passing through the dichroic mirror 192, the probe beam 135 passes through the dichroic mirror 194 and the objective 196 and impinges on the semiconductor sample 200. In some embodiments, the modulated pump beam 133 and the probe beam 135 are focused at substantially the same spot on the surface 222 of the semiconductor layer 220. By focusing the modulated pump beam 133 and the probe beam 135 at substantially the same spot, high signal output intensity can be achieved.

It is to be understood that the reflectivity signals of interest exist at any area on the semiconductor sample 200 whose reflectivity signals has been periodically modulated by the modulated pump beam 133. Therefore, the probe beam 135 would not have to be directly coincident with the modulated pump beam 133 to detect the signals of interest. Accordingly, the objective 196 is not necessary for focusing either the modulated pump beam 133 or the probe beam 135. Rather, it can direct the probe beam 135 within at least a portion of the periodically modulated area of the semiconductor sample 200.

In FIG. 3C, when the probe beam 135 impinges on the semiconductor layer 220, a portion of the probe beam 135 is reflected from the surface 222 of the semiconductor layer 220, and another portion of the probe beam 135 passes through the semiconductor layer 220 and is reflected from the surface 214 of the implantation layer 212 of the semiconductor substrate 210 due to the optical property difference between the semiconductor layer 220 and the implantation layer 212. These two portions of the reflected probe beam 135' form an interference effect, and the interference information thereof depends on the thickness T of the semiconductor layer 220.

At operation 36, the probe beam 135' reflected from the semiconductor layer 220 and the implantation region 212 is detected to determine the thickness T of the semiconductor layer 220. In other words, the thickness T of the semiconductor layer 220 is evaluated according to the interference information of the probe beam 135' reflected from the semiconductor layer 220 and the implantation region 212. The reflected probe beam 135' results from the interference effect. The reflected probe beam 135' impinges on the dichroic mirror 194 and then reflects to the detector 136. In some embodiments, a filter (not shown) is provided to block pump beam 133 from reaching the detector 136. The detector 136 provides output signals which are proportional to the powers of the reflected probe beam 135'. The detector 136 can be arranged to be underfilled so that its output can be insensitive to different changes in beam diameter or position. In some embodiments, the detector 136 is a quad cell generating four separate outputs. When used to measure a reflected beam power, the output of all four quadrants are summed. In some other embodiments, the detector 136 can measure the deflection of the reflected probe beam 135'. In these cases, the output of one adjacent pair of quadrants is summed and subtracted from the sum of the remaining pair of quadrants.

In the aforementioned embodiments, the semiconductor substrate 210 and the semiconductor layer 220 share at least one common material or element. The semiconductor layer 220 and the semiconductor substrate 210 may be formed of substantially the same material. Before the modulated pump beam 133' impinges on the semiconductor sample 200, the dielectric properties and/or optical properties of the semiconductor substrate 210, the implantation region 212, and the semiconductor layer 220 are similar, such that the difference therebetween is not easy to be observed. However, when the pump beam 133' impinges on the semiconductor sample 200, the free carriers are generated in the implantation region 212. The dielectric properties and/or optical properties of the implantation region 212 are different from the semiconductor layer 220. Hence, the implantation region 212 can be a reference layer to obtain the thickness T of the semiconductor layer 220. In addition, the metrology apparatus 130 can measure the thickness T in a non-destructive and non-contact manner, preventing the semiconductor sample 200 from damage.

Figure 5A:
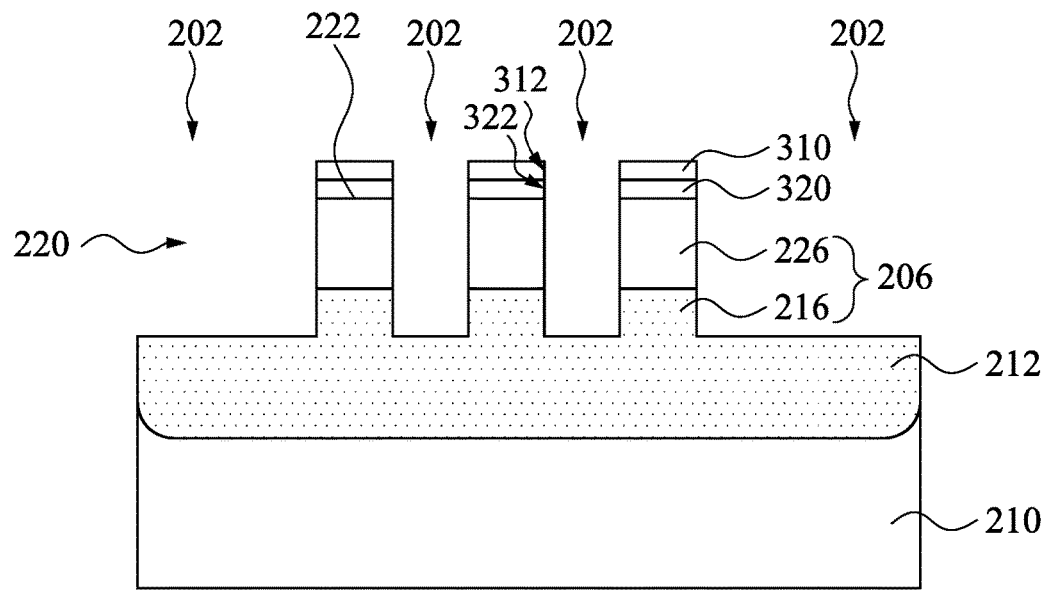
FIGS. 5A to 5E are cross-sectional views of a method for manufacturing a semiconductor device using the semiconductor sample of FIG. 3C at various stages in accordance with some embodiments of the present disclosure.

In some embodiments, the semiconductor sample 200 of FIG. 3C can be applied to form a fin field effect transistor (finFET) device, and the claimed scope is not limited in this respect. FIGS. 5A to 5E are cross-sectional views of a method for manufacturing a semiconductor device using the semiconductor sample 200 of FIG. 3C at various stages in accordance with some embodiments of the present disclosure. Reference is made to FIG. 5A. A patterned mask layer 310 and a patterned protective layer 320 underneath formed over the surface 222 of the semiconductor layer 220. The protective layer 320 protects the surface 222 from direct contact with the mask layer 310. The protective layer 320 can be made of a thermal oxide, in some embodiments. The thickness of the protective layer 320 is in a range from about 20 nm to about 100 nm. In some embodiments, the mask layer 310 is used as a planarization stop layer during the removal of excess dielectric film that fills trenches 202 underneath. In some embodiments, the mask layer 310 is made of SiN. However, other materials, such as SiON, silicon carbide, or combinations thereof, may also be used. The thickness of the mask layer 310 is in a range from about 200 nm to about 1200 nm. The mask layer 310 may be formed by a process such as CVD, plasma enhanced chemical vapor deposition (PECVD), or low pressure chemical vapor deposition (LPCVD). Alternatively, the mask layer 310 may be first made of a silicon oxide and then converted to SiN by nitridation. Once formed, the hard mask layer 310 and the protective layer 320 are patterned through suitable photolithographic and etching processes to form the openings 312 and 322 over the surface 222.

Then, a plurality of trenches 202 are formed in the semiconductor layer 220 and the semiconductor substrate 210 through the openings 312 and 322. Adjacent two of the trenches 202 define a semiconductor fin 206 therebetween. The semiconductor fin 206 includes a top portion 226 formed of the semiconductor layer 220 and a bottom portion 216 formed of the implantation region 212 of the semiconductor substrate 210. The trenches 202 may be formed by using etching process, such as reactive ion etching (RIE). It is noted that although there are three semiconductor fins 206 in FIG. 5A, the claimed scope of the present disclosure is not limited in this respect. In some other embodiments, a person having ordinary skill in the art can manufacture suitable number of the semiconductor fins 206 of the semiconductor device according to actual situations.

Figure 5B:
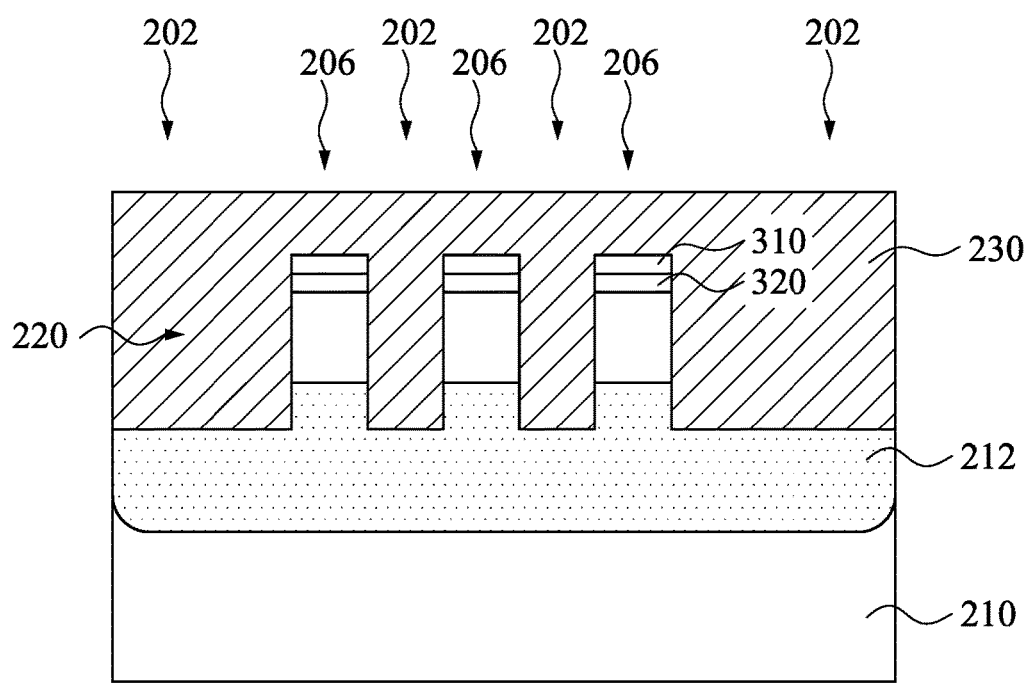

Reference is made to FIG. 5B. A dielectric material overfills the trenches 202 and the mask layer 310 to form a dielectric layer 230. In some embodiments, the dielectric material is flowable. The dielectric layer 230 can be formed by using a spin on dielectric (SOD) formation process, or by depositing a dielectric by a CVD process, such as radical-component CVD. The examples, of precursors, include a silicate, a siloxane, a methyl SilsesQuioxane (MSQ), a hydrogen SisesQuioxane (HSQ), an MSQ/HSQ, a perhydrosilazane (TCPS), a perhydro-polysilazane (PSZ), a tetraethyl orthosilicate (TEOS), or a silyl-amine (SA).

In some embodiments, the dielectric layer 230 is deposited by using a silicon-containing precursor to react with another precursor, such as a "radical-nitrogen" precursor generated by a plasma. In some embodiments, the silicon-containing precursor is carbon-free and includes silyl-amines, such as $H_2N(SiH_3)$, $HN(SiH_3)_2$, $N(SiH_3)_3$, or combinations thereof. The silyl-amines may be mixed with additional gases that may act as carrier gases, reactive gases, or both. Examples of the additional gases may include $H_2$, $N_2$, $NH_3$, He, and Ar, among other gases. Silyl-amines may also be mixed with other carbon-free silicon-containing gas(es), such as silane ($SiH_4$) and disilane ($Si_2H_6$), hydrogen (e.g. $H_2$), and/or nitrogen (e.g. $N_2$, $NH_3$). In some embodiments, liner layer (not shown) are formed in the trenches 202 and underneath the dielectric layer 230.

Figure 5C:
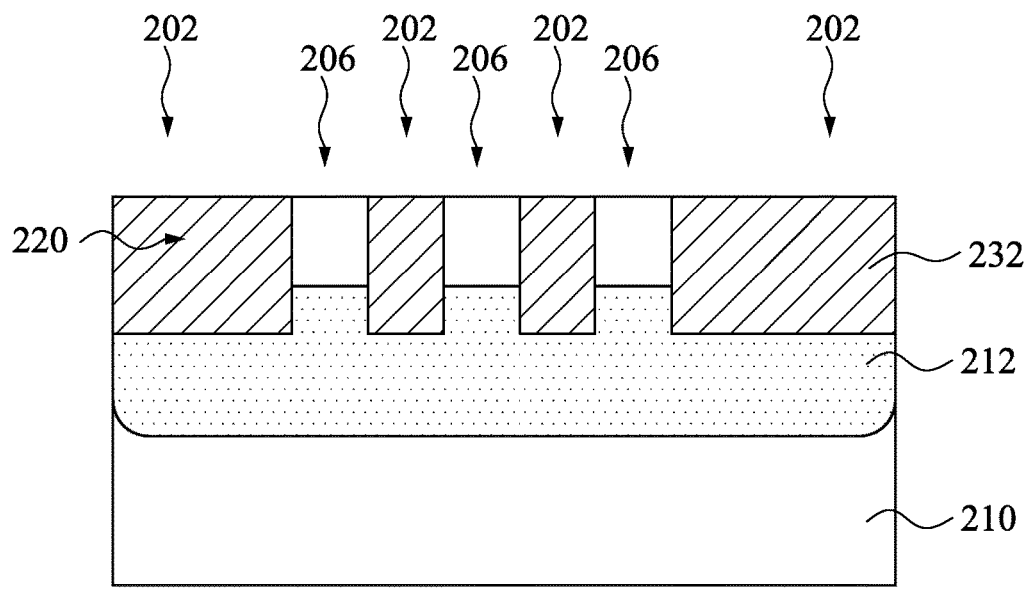

Reference is made to FIG. 5C. The excess dielectric layer 230 (see FIG. 5B) outside the trenches 202 and the mask layer 310 (see FIG. 5B) is removed to form isolation layers 232 in the trenches 202 through a process such as chemical mechanical polishing (CMP), an etch, or combinations thereof. In some embodiments, the removal process also removes the protective layer 320 of FIG. 5B. In some other embodiments, the removal process removes the mask layer 310 of FIG. 5B; however, the protective layer 320 is removed by an etching process.

Figure 5D:
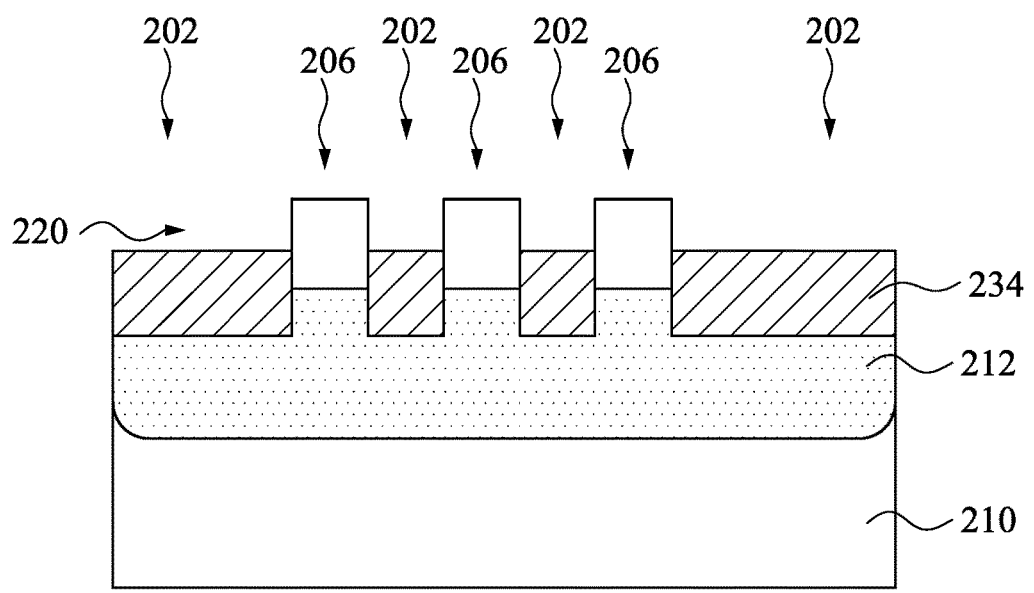

Reference is made to FIG. 5D. An etching process is performed to remove the portions of the isolation layers 232 of FIG. 5C until a predetermined depth is reached and form the isolation structures 234. The semiconductor fins 206 then protrude higher than the isolation structures 234. In some embodiments, the etching process may be a dry etching process to etch the isolation layers 232 of FIG. 5C until a predetermined depth is reached. The process gas used in the dry etching process may include hydrogen atoms, for example, using hydrofluoric (HF) and ammonia ($NH_3$) based process gases to etch the isolation layers 232.

Figure 5E:
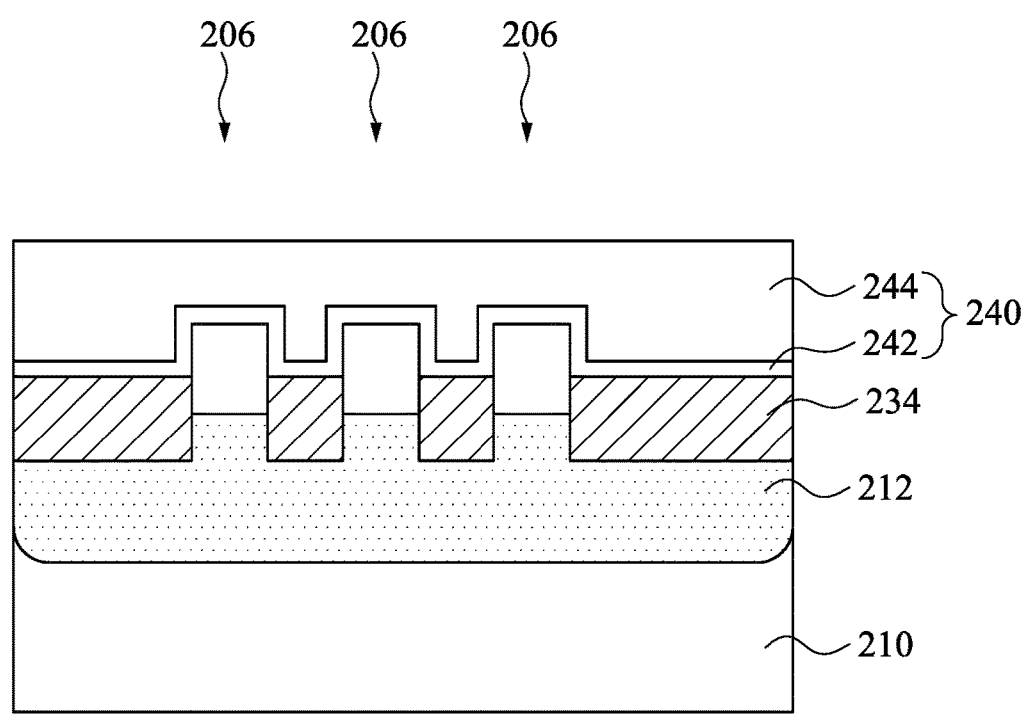
Figure 6:
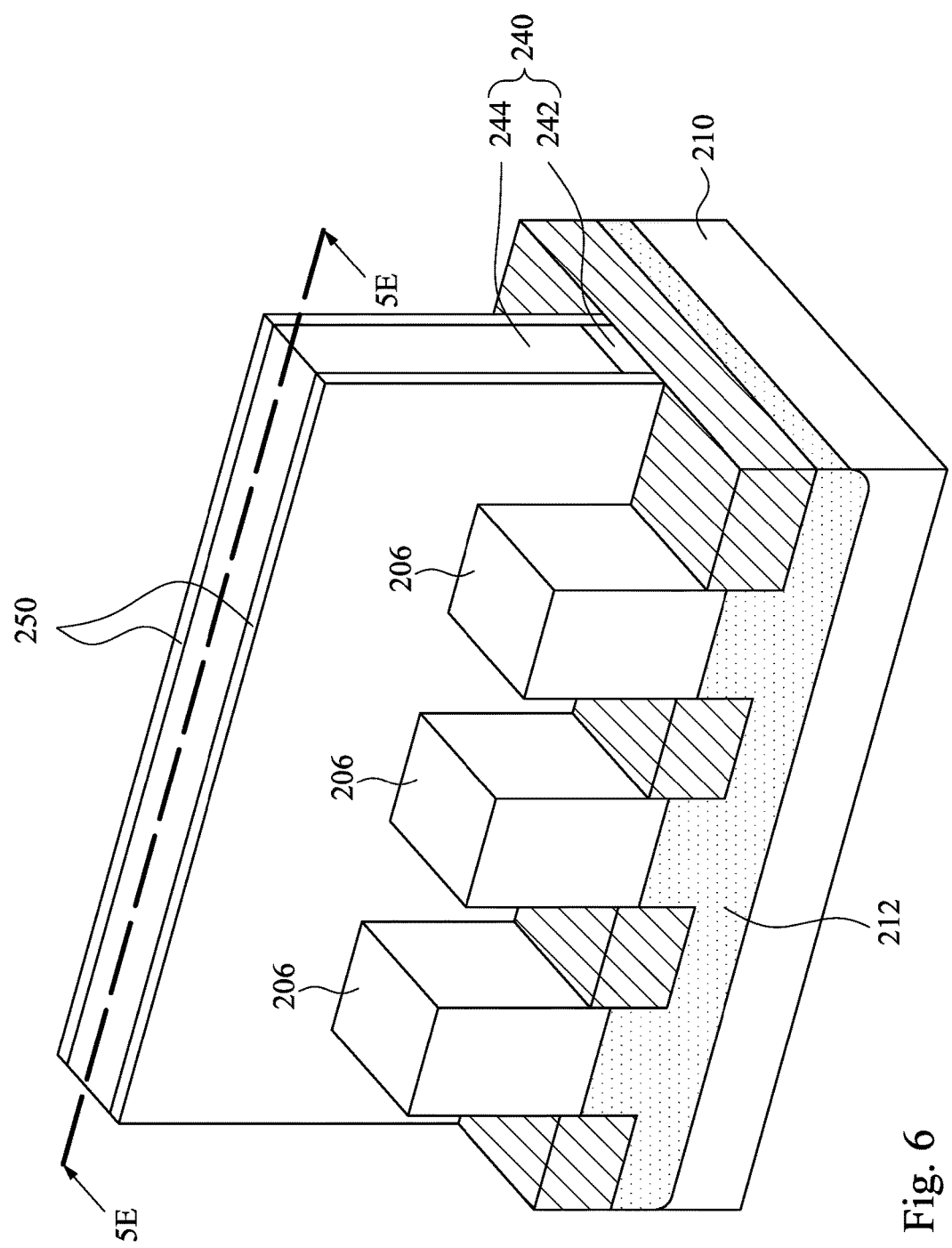
FIG. 6 is a perspective view of the semiconductor device of FIG. 5E in some embodiments.

Reference is made to FIGS. 5E and FIG. 6, where FIG. 6 is a perspective view of the semiconductor device of FIG. 5E in some embodiments, and FIG. 5E is a cross-sectional view taken along line 5E-5E of FIG. 6. A gate stack 240 is formed on portions of the semiconductor fins 206 and exposes other portions of the semiconductor fins 206. The portions of the semiconductor fins 206 covered by the gate stack 240 form channel features, and the other portions of the semiconductor fins 206 uncovered by the gate stack 240 form source/drain features.

The gate stack 240 includes a gate insulator layer 242 and a gate electrode layer 244. The gate insulator layer 242 is disposed between the gate electrode layer 244 and the semiconductor substrate 210, and is formed on the semiconductor fins 206. The gate insulator layer 242, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (Hf-SiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate insulator layer 242 may have a multilayer structure such as one layer of silicon oxide (e.g., interfacial layer) and another layer of high-k material. The gate insulator layer 242 may be formed using chemical vapor deposition (CVD), physical vapor deposition (PVD), atomic layer deposition (ALD), thermal oxide, ozone oxidation, other suitable processes, or combinations thereof.

The gate electrode layer 244 is formed over the semiconductor substrate 210 to cover the gate insulator layer 242 and the portions of the semiconductor fins 206. In some embodiments, the gate electrode layer 244 includes a semiconductor material such as polysilicon, amorphous silicon, or the like. The gate electrode layer 244 may be deposited doped or undoped. For example, in some embodiments, the gate electrode layer 244 includes polysilicon deposited undoped by low-pressure chemical vapor deposition (LPCVD). Once applied, the polysilicon may be doped with, for example, phosphorous ions (or other P-type dopants) to form a PMOS device or boron (or other N-type dopants) to form an NMOS device. The polysilicon may also be deposited, for example, by furnace deposition of an in-situ doped polysilicon. Alternatively, the gate electrode layer 244 may cinclude a polysilicon metal alloy or a metal gate including metals such as tungsten (W), nickel (Ni), aluminum (Al), tantalum (Ta), titanium (Ti), or any combination thereof.

In FIG. 6, a pair of dielectric layers 250 are formed over the semiconductor substrate 210 and along the side of the gate stack 240. In some embodiments, the dielectric layers 250 may include silicon oxide, silicon nitride, silicon oxynitride, or other suitable material. The dielectric layers 250 may include a single layer or multilayer structure. A blanket layer of the dielectric layers 250 may be formed by CVD, PVD, ALD, or other suitable technique. Then, an anisotropic etching is performed on the blanket layer to form a pair of the dielectric layer 250 on two sides of the gate stack 240. In some embodiments, the dielectric layers 250 are used to offset subsequently formed doped regions, such as source/drain regions. The dielectric layers 250 may further be used for designing or modifying the source/drain region (junction) profile.

According to the aforementioned embodiments, the semiconductor substrate and the semiconductor layer share at least one common material or may be made of substantially the same material. Before the modulated pump beam impinges on the semiconductor sample, the dielectric properties and/or optical properties of the semiconductor substrate, the implantation region, and the semiconductor layer are similar, such that the difference therebetween is not easy to be observed. However, when the pump beam impinges on the semiconductor sample, free carriers are generated in the implantation region. The optical properties of the implantation region are different from the semiconductor layer. Hence, the implantation region can be a reference layer to obtain the thickness of the semiconductor layer. In addition, the metrology apparatus can measure the thickness in a non-destructive and non-contact manner, preventing the semiconductor sample from damage.

According to some embodiments, a method for thickness measurement includes forming an implantation region in a semiconductor substrate. A semiconductor layer is formed on the implantation region of the semiconductor substrate. Modulated free carriers are generated in the implantation region of the semiconductor substrate. A probe beam is provided on the semiconductor layer and the implantation region of the semiconductor substrate with the modulated free carriers therein. The probe beam reflected from the semiconductor layer and the implantation region is detected to determine a thickness of the semiconductor layer.

According to some embodiments, a method for thickness measurement includes doping a semiconductor substrate to form a doped region therein. The doped region is annealed. A semiconductor layer is grown on the doped region of the semiconductor substrate. The doped region of the semiconductor substrate is photomodulated. A probe beam is provided on the semiconductor layer and the photomodulated doped region. A thickness of the semiconductor layer is evaluated according to an interference information of the probe beam reflected from the semiconductor layer and the doped region.

According to some embodiments, a metrology system includes an implantation apparatus, a deposition apparatus, and a metrology apparatus. The implantation apparatus is configured to form an implantation region in a semiconductor substrate. The deposition apparatus is configured to form a semiconductor layer on the implantation region of the semiconductor substrate. The metrology apparatus includes a photomodulation source, a probe source, and a detector. The photomodulation source is configured to generate modulated free carriers in the implantation region of the semiconductor substrate. The probe source is configured to provide a probe beam on the semiconductor layer and the implantation region. The detector is configured to detect the probe beam reflected from the semiconductor layer and the implantation region to determine a thickness of the semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for thickness measurement comprising:
    forming an implantation region in a semiconductor substrate;
    after forming the implantation region in the semiconductor substrate, forming a semiconductor layer on the implantation region of the semiconductor substrate;
    after forming the semiconductor layer on the implantation region, generating modulated free carriers in the implantation region of the semiconductor substrate, wherein the generating the modulated free carriers comprises:
        providing a pump beam;
        intensity modulating the pump beam into a modulated pump beam; and
        directing the modulated pump beam to impinge on the implantation region of the semiconductor substrate to generate the modulated free carriers;
    providing a probe beam on the semiconductor layer and the implantation region of the semiconductor substrate with the modulated free carriers therein; and
    detecting the probe beam reflected from the semiconductor layer and the implantation region to determine a thickness of the semiconductor layer.

2. The method of claim 1, wherein the semiconductor substrate and the semiconductor layer are formed of substantially the same material.

3. The method of claim 1, wherein a dielectric constant of the semiconductor substrate and a dielectric constant of the semiconductor layer have a difference less than about $10^{-2}$.

4. The method of claim 1, further comprising:
    annealing the implantation region of the semiconductor substrate.

5. The method of claim 1, wherein the semiconductor layer is formed by using an epitaxy process.

6. The method of claim 1, wherein the pump beam is a laser beam.

7. The method of claim 1, wherein the pump beam and the probe beam have different wavelengths.

8. The method of claim 1, wherein the probe beam is a laser beam.

9. The method of claim 1, wherein the implantation region is a p-type implantation region.

10. The method of claim 1, wherein the implantation region is an n-type implantation region.

11. The method of claim 1, wherein the semiconductor substrate and the semiconductor layer have substantially the same optical properties.

12. A method for thickness measurement comprising:
    doping a semiconductor substrate to form a doped region therein;
    annealing the doped region;
    growing a semiconductor layer on the doped region of the semiconductor substrate;
    providing a photomodulating beam to photomodulate the doped region of the semiconductor substrate, wherein the providing a photomodulating beam comprises:
        providing a pump beam;
        intensity modulating the pump beam into the photomodulating beam; and
        directing the photomodulating beam to impinge on the doped region of the semiconductor substrate to generate modulated free carriers;
    while providing a photomodulating beam, providing a probe beam on the semiconductor layer and the photomodulated doped region, the probe beam being different from the photomodulating beam; and
    evaluating a thickness of the semiconductor layer according to an interference information of the probe beam reflected from the semiconductor layer and the doped region.

13. The method of claim 12, wherein the semiconductor layer is in contact with the semiconductor substrate.

14. The method of claim 12, wherein a dielectric constant of the semiconductor substrate and a dielectric constant of the semiconductor layer have a difference less than about $10^{-2}$.

15. The method of claim 12, wherein the semiconductor substrate and the semiconductor layer have substantially the same optical properties.

16. A metrology system comprising:
    an implantation apparatus configured to form an implantation region in a semiconductor substrate;
    a deposition apparatus configured to form a semiconductor layer on the implantation region of the semiconductor substrate; and
    a metrology apparatus, comprising:
        a photomodulation source configured to generate modulated free carriers in the implantation region of the semiconductor substrate, wherein the photomodulation source comprises:
            a light source configured to provide a pump beam; and
            a modulator configured to modulate an intensity of the pump beam into a modulated pump beam and direct the modulated pump beam to impinge on the implantation region of the semiconductor substrate to generate the modulated free carriers;

a probe source configured to provide a probe beam on the semiconductor layer and the implantation region, the probe beam being provided simultaneously with the generation of modulated free carriers in the implantation region; and a detector configured to detect the probe beam reflected from the semiconductor layer and the implantation region to determine a thickness of the semiconductor layer.

17. The metrology system of claim 16, further comprising:
an annealing apparatus configured to anneal the implantation region of the semiconductor substrate.

18. The metrology system of claim 16, wherein the light source is a laser.

19. The metrology system of claim 16, wherein the probe source is a laser.

20. The metrology system of claim 16, wherein the pump beam and the probe source have different wavelengths.

* * * * *